United States Patent
Kachi et al.

(10) Patent No.: US 7,084,432 B2
(45) Date of Patent: Aug. 1, 2006

(54) NITRIDE SEMICONDUCTOR LIGHT EMITTING DIODE

(75) Inventors: Tetsu Kachi, Nisshin (JP); Satoru Kato, Nisshin (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 344 days.

(21) Appl. No.: 10/617,655

(22) Filed: Jul. 14, 2003

(65) Prior Publication Data
US 2004/0016937 A1    Jan. 29, 2004

(30) Foreign Application Priority Data
Jul. 23, 2002 (JP) ............... 2002-214322

(51) Int. Cl.
H01L 27/15  (2006.01)
H01L 31/12  (2006.01)
H01L 33/00  (2006.01)

(52) U.S. Cl. ............... 257/81; 257/98; 257/99
(58) Field of Classification Search ............... 257/13, 257/79–84, 97–99
See application file for complete search history.

(56) References Cited

U.S. PATENT DOCUMENTS 5,557,115 A * 9/1996 Shakuda ............... 257/81
6,903,376 B1 * 6/2005 Shen et al. ............... 257/81
2001/0004189 A1 * 6/2001 Seki ............... 313/498
2002/0047128 A1 * 4/2002 Song et al. ............... 257/82

FOREIGN PATENT DOCUMENTS

| JP | 08-213654 | 8/1996 |
| JP | 11-251631 | 9/1999 |
| JP | 2002-198562 | 7/2002 |

* cited by examiner

*Primary Examiner*—Thien F. Tran
(74) *Attorney, Agent, or Firm*—Oblon, Spivak, McClelland, Maier & Neustadt, P.C.

(57) ABSTRACT

An increased proportion of light projected from a nitride semiconductor light emitting diode enters the area within a specified angle.

The nitride semiconductor light emitting diode is provided with an active layer 32 consisting of a nitride semiconductor, and a light projecting face 21. A reflecting mirror 38 is formed only on a side of the active layer 32 opposite the light projecting face 21. The reflecting mirror 38 is formed at a location from the center of the active layer 32 approximately $(k \cdot \lambda/2 + \lambda/4)/n$ (where $\lambda$ is the wavelength of light projected from the active layer 32, n is the mean refractive index of an area between the active layer 32 and the reflecting mirror 38, and k is an integer). This light emitting diode allows directivity to be increased sufficiently, and the coupling efficiency thereof with optical fiber consisting of POF or the like can be improved.

5 Claims, 13 Drawing Sheets

NITRIDE SEMICONDUCTOR LIGHT EMITTING DIODE

RELATED APPLICATION

The present application claims priority on the Japanese Application No. 2002-214322, filed Jul. 23, 2002.

BACKGROUND OF THE INVENTION

1. Field of the Invention

The present invention relates to a nitride semiconductor light emitting diode.

2. Related Art

A nitride semiconductor light emitting diode (hereafter abbreviated to 'light emitting diode') having a nitride semiconductor active layer is known in the art. As shown in FIG. 22(A), light projected from an active layer 132 of a light emitting diode 120 forms a spherical wave spreading in all directions. The intensity distribution of the projected light is a function of the cosine of the angle θ, as shown in FIG. 22(B). Directivity is not observed.

Since conventional light emitting diodes are mainly used for displays, there is no particular need to improve the directivity of the projected light from the light emitting diodes. Instead, the main aim of the light emitting diode is to improve visibility.

A light emitting diode is known wherein a reflecting mirror is formed on only one of the two sides of the active layer, this reflecting mirror being on the side opposite a light projecting face. In this light emitting diode, light emitted toward the side opposite the light projecting face is reflected toward the light projecting face by the reflecting mirror. This somewhat improves the directivity of the projected light, and ensures high visibility.

Further, a light emitting diode provided with a transparent resin mold having a lens attached thereto is known in the art. In this light emitting diode, the lens contained in the transparent resin mold somewhat improves the directivity of the projected light, and ensures high visibility.

Since the main aim in conventional light emitting diodes is to ensure high visibility, these conventional light emitting diodes have low directivity of the projected light, and the projected light spreads across a wide area. Although techniques of using a reflecting mirror or a lens to improve the directivity of the projected light are known, the directivity attained by this means remains unsatisfactory.

Light sources for optical communications require light with a high output and a high degree of directivity. For this, semiconductor lasers, which have a high output and a high degree of directivity, are used. However, there has been no particular need to increase directivity in nitride semiconductor light emitting diodes, since these are mainly used for displays, and research that satisfactorily increases directivity has not been performed.

We have recognized that short range optical communications need not utilize a high output semiconductor laser that requires a resonator structure, instead, a light emitting diode that does not require a resonator structure is often sufficient. The light emitting diode has a simpler structure than a semiconductor laser, the manufacturing process thereof is simpler, and the cost is lower. Consequently, there would be great merit in having the light source for short range optical communications comprising of, if possible, a light emitting diode, this being cheaper due to its not requiring the resonator structure, instead of the semiconductor laser, which is expensive due to its requiring the resonator structure.

In recent years, short range optical communications are being employed that utilize plastic optical fiber (hereafter, for convenience, referred to as 'POF'). POF rather than silica glass is being utilized in short range optical communications because POF is (1) cheaper, (2) connecting operations are easier, etc. The POF utilized in these short range optical communications has high transmissivity in the range of visible light. Nitride semiconductor light emitting diodes, which emit short wavelengths (blue light and green light) of visible light, are suitable as a light source for POF.

Further, it is difficult to obtain good quality crystal growth with nitride semiconductors that emit short wavelengths (blue light and green light) of visible light, therefore, nitride semiconductor lasers are not yet practical.

From the viewpoint of wavelength of emitted light, the nitride semiconductor light emitting diode is suitable as a light source for POF, and additionally the price thereof is more advantageous than of the laser. However, since the directivity thereof is low, light fails to enter the optical fibers, with the result that coupling efficiency with optical fibers is low.

The light that is able to enter the optical fibers (represented here by POF) is restricted only to that light that is within the range of the angle of incidence of the optical fibers, this being determined by the configuration of the optical fibers (usually approximately ±15 degrees in the case of POF). When light projected by conventional light emitting diodes is to enter optical fibers, the light projected by the light emitting diode spreads widely beyond the range of the angle of incidence of the optical fibers, and the proportion of projected light unable to enter the optic fiber is high.

As shown in FIG. 23, the conventional light emitting diode has a rectangular first electrode 138 that supplies electric current flowing through an active layer. A second electrode 128 has an approximately semicircular shape, a portion of the rectangular first electrode 138 being cut away in a semicircular shape so as to surround the semicircular second electrode 128. Since almost all conventional light emitting diodes are used as displays, the light emitting area must be large. When a plurality of light emitting diodes formed on a substrate is to be separated into chips, cleavage or the like is normally used for separation, and consequently each chip is rectangular. A rectangular electrode is formed along each rectangular chip so as to increase the light emitting area thereof.

FIG. 24 shows numeric values for the intensity distribution of the emitted light of the conventional light emitting diode having the electrode configuration shown in FIG. 23. With this type of electrode configuration, an electric current does not flow with a uniform current density through the electrode 138, there being lower resistance in the region of the electrode 138 closer to the opposing electrode 128, and the current density consequently being higher. Light is emitted with higher intensity from the areas of the active layer that have a higher current density. Further, since electric fields are concentrated more readily in corners, the current density in the corners is higher, and the intensity of emitted light is higher. This is why, of the area of the electrode 138 closer to the opposing electrode 128, the corner areas thereof have a higher intensity of emitted light (see FIG. 24).

Transient behavior is also important, particularly in cases where modulation in light intensity is utilized, such as optical communications. However, if electric current first flows to areas in which the electric current flows most readily, the resistance in those areas drops, and a phenomenon is likely to occur whereby the electric current is concentrated in those areas.

FIG. 25 shows light projected from a conventional light emitting diode 120 entering an optical fiber. A high proportion of the light projected from the conventional light emitting diode 120 is unable to enter the optic fiber. One reason for this is that the directivity of the light projected from the conventional light emitting diode 120 is low, and so a large quantity of light leaks from the optical fiber. A second reason for this is that the intensity of light in the left half of FIG. 24 and the intensity of light in the right half thereof are asymmetrical. As shown in FIG. 25, the projected light distribution from the left half and right half areas of the active layer is polarized (polarized asymmetrically), a large quantity of the light emitted from the left half area of the active layer being projected outside the range of the angle of incidence of the optical fiber, as shown by FIG. 10B. This is one reason why the proportion of light projected from the light emitting diode that is able to enter the optical fiber (i.e., the coupling efficiency of the light emitting diode with the optical fiber) is low.

SUMMARY OF THE INVENTION

One aim of the present invention is to realize a technique for increasing the directivity of light projected from a nitride semiconductor light emitting diode.

A further aim of the present invention is to realize a technique for suppressing the asymmetrical polarization of the projected light distributed from the nitride semiconductor light emitting diode.

Yet another aim of the present invention is to realize a technique for improving the coupling efficiency between the nitride semiconductor light emitting diode and an optical fiber.

The nitride semiconductor light emitting diode embodied in the present invention is provided with a substrate and a nitride semiconductor grown on the substrate. The nitride semiconductor is thick at a central portion thereof and thin at a peripheral portion thereof, an active layer being formed in the thick central portion. A first electrode is formed in an upper face of the thick central portion, and a second electrode is formed in an upper face of the thin peripheral portion. A reflecting mirror is formed at one side of the active layer formed in the thick central portion. The reflecting mirror is located at a distance of approximately $(k \cdot \lambda/2 + \lambda/4)/n$ from a center of the active layer. In the above formula, $\lambda$ is the wavelength of light projected from the active layer, n is the mean refractive index of an area between the active layer and the reflecting mirror, and k is an integer.

This light emitting diode has the reflecting mirror formed only on one of the two sides of the active layer, that is, on the side opposite a light projecting face thereof. Moreover, it is an important characteristic of this light emitting diode that the distance between the reflecting mirror and the center of the active layer satisfies the above formula.

When the distance between the reflecting mirror and the center of the active layer satisfies the above formula, light projected from the active layer in a perpendicular manner toward the light projecting face, and light projected from the active layer in a perpendicular manner toward the reflecting mirror and reflected therefrom, mutually interferes, and becomes stronger. However, light projected from the active layer in an inclined manner toward the light projecting face, and light projected from the active layer in an inclined manner toward the reflecting mirror and reflected in an inclined manner therefrom, mutually interferes, and becomes weaker. As a result, the spread of light is substantially narrower than in the case of the conventional light emitting diode, and directivity can be substantially improved. The intensity of light projected in the area within a specified angle can be increased.

The light emitting diode allows an increased proportion of light to enter optical fiber such as POF. The light emitting diode allows the coupling efficiency with the optical fiber to improve. By specifying the distance, as with the above formula, between the reflecting mirror and the center of the active layer, the light emitting diode of the present invention differs greatly from the conventional light emitting diode having a reflecting mirror attached thereto.

The definition of the reflecting mirror being at 'a distance from the center of the active layer of approximately $(k \cdot \lambda/2 + \lambda/4)/n$' includes the reflecting mirror being at a distance equal to and within approximately ±10% of $(k \cdot \lambda/2 + \lambda/4)/n$ from the center of the active layer. If the reflecting mirror is formed within this range of distance, the directivity of the projected light can be improved.

It is preferred that the reflecting mirror also functions simultaneously as an electrode for allowing electric current to flow through the active layer. By having the reflecting mirror also functions as the electrode, a light emitting diode that has a simple configuration and is easy to manufacture is utilized to improve the directivity of the projected light.

It is preferred that a convex lens is formed on the light projecting face. Since light is projected after having been concentrated by the convex lens, directivity can be further improved. The coupling efficiency of the light emitting diode can be improved further.

The first electrode and the second electrode are formed on the face opposite the substrate. It is an important characteristic of the light emitting diode of the present invention that the first electrode is located at the central portion of the nitride semiconductor substrate, and the second electrode is located at the peripheral portion of the nitride semiconductor substrate.

In this light emitting diode, asymmetrical polarization in the distribution of electric current flowing through the active layer can be suppressed. The asymmetrical polarization in emitted light intensity that occurs in the conventional light emitting diode shown in FIG. 24 can be suppressed.

In this light emitting diode, an increased proportion of light can enter the area within a specified angle. The coupling efficiency between the light emitting diode and the optical fiber can be improved.

It is preferred that the first electrode is surrounded by the second electrode when viewed from a direction perpendicular to the substrate. Further, it is preferred that the center of the first electrode and the center of the second electrode are coincident. The asymmetrical polarization in the distribution of emitted light intensity can effectively be suppressed.

It is preferred that, when viewed from a direction perpendicular to the substrate, the outer circumference shape of the first electrode has a shape resembling the inner circumference shape or the outer circumference shape of the second electrode. For example, in the case where the outer shape of the first electrode is polygonal, it is preferred that the inner profile or the outer profile of the second electrode is a similar polygonal shape.

In this case, the asymmetrical polarization in the distribution of electric current flowing through the active layer can be reduced. As a result, an increased proportion of light projected from the light emitting diode can be concentrated within the area within a specified angle.

It is preferred that the profile of at least one of the first electrode and the second electrode forms a smooth continuum and contains no corners. In this light emitting diode, since no corners are formed in the electrode, the phenomenon does not occur whereby electric fields are concentrated at corners of the electrode, and the nonuniformity in the distribution of electric current flowing through the active layer can be reduced. As a result, an increased proportion of light projected from the light emitting diode can be concentrated within the area within a specified angle.

A particularly suitable aspect is, when viewed from a direction perpendicular to the substrate, that the first electrode is preferably circular and the second electrode has a ring shape concentric with the first electrode. With this configuration, point symmetry in the distribution of electric current flowing through the active layer can be attained, and asymmetrical polarization in the distribution of electric current flowing through the active layer scarcely occurs. An increased proportion of the light projected from the light emitting diode can be concentrated within the area within a specified angle.

PREFERRED EMBODIMENTS

Figure 1:
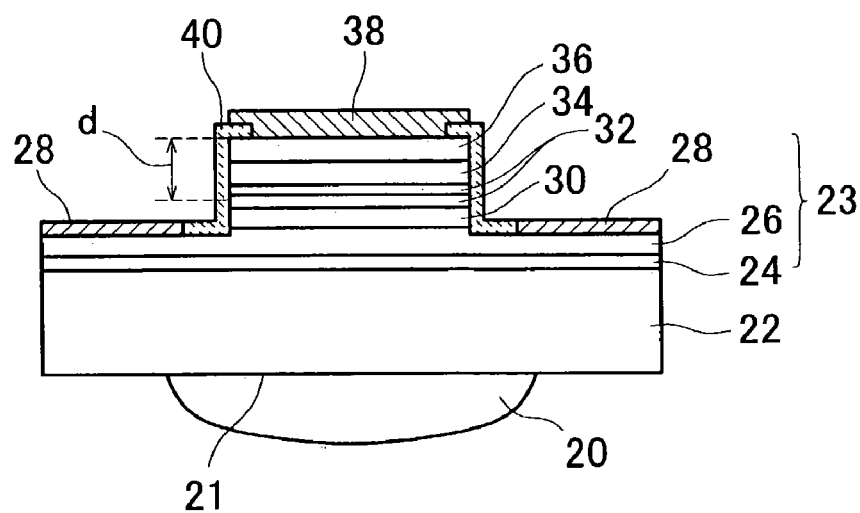
FIG. 1 shows a schematic cross-sectional view showing a light emitting diode of an embodiment of the present invention.
Figure 2:
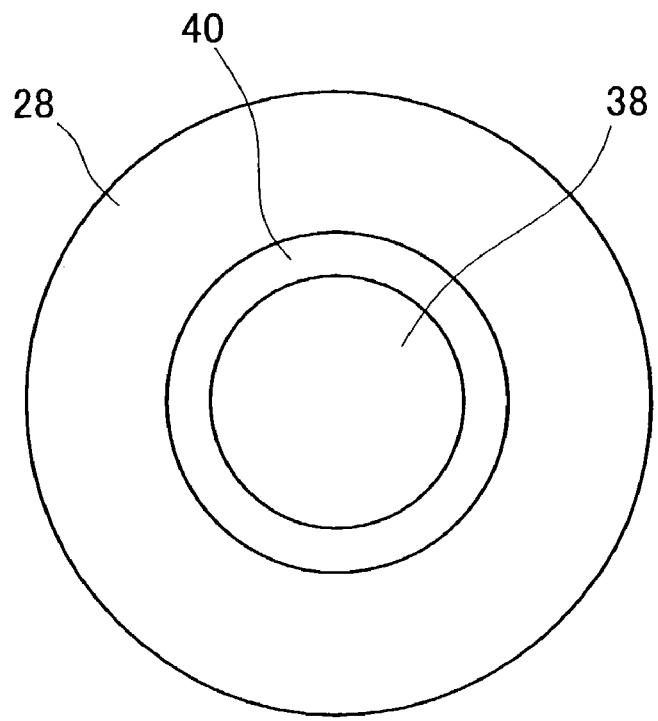
FIG. 2 shows a schematic plan view showing the light emitting diode of the embodiment of the present invention.

FIG. 1 is a schematic cross-sectional view showing a light emitting diode of an embodiment of the present invention, and FIG. 2 is a schematic plan view thereof. The light emitting diode is provided with a substrate 22, a layer structure 23, a p-electrode 38, an n-electrode 28, a silicon oxide film 40, and a lens 20. Laminated in the following sequence above the substrate 22 to form the layer structure 23 are: a buffer layer 24, an n-type contact layer 26, an n-type cladding layer 30, an active layer 32, a p-type cladding layer 34, and a p-type contact layer 36.

The substrate 22 may be formed from sapphire ($Al_2O_3$). Other material suitable for growing a nitride semiconductor, such as spinel ($MgAl_2O_4$), SiC, ZnO, GaN, etc. may be used as the substrate 22. The substrate 22 is transparent and is insulating. A back face of the substrate 22 is a light projecting face 21.

The buffer layer 24 may be formed from, for example, GaN, AlN, AlGaN, etc. The film thickness may be, for example, approximately 5 nm–1 μm so as to attenuate lattice mismatching between the substrate 22 and the nitride semiconductor. Further, the buffer layer 24 need not be formed in the case where the substrate 22 being utilized has a lattice parameter close to or identical with the nitride semiconductor.

The n-type contact layer 26 is, for example, an n-type GaN layer, and is preferably an n-type GaN layer doped with Si. These layers may also include an undoped nitride semiconductor layer.

The n-type cladding layer 30 may be an n-type AlGaN layer, and is preferably an n-type AlGaN layer doped with Si.

The active layer 32 preferably has a SQW (Single-Quantum-Well) or MQW (Multi-Quantum-Well) configuration. The quantum-well configuration allows a light emitting diode with a high output to be attained. The single-quantum-well configuration preferably consists of $In_xGa_{1-x}N$ ($0 \leq X < 1$). The multi-quantum-well configuration preferably has a well layer consisting of $In_xGa_{1-x}N$ and a blocking layer consisting of $In_yGa_{1-y}N$ ($Y<X$, and $Y$ may be zero).

The p-type cladding layer 34 is, for example, an AlGaN layer, and is preferably a p-type AlGaN layer doped with Mg.

The p-type contact layer 36 is, for example, p-type GaN, and is preferably formed from p-type GaN doped with Mg. These layers may also include an undoped nitride semiconductor layer. Since the p-type contact layer 36 makes contact with the p-electrode 38, it is important that ohmic contact is attained.

The p-electrode 38 also plays the role of a reflecting mirror that reflects the light from the active layer 32. Taking the light-reflecting role thereof into consideration, the p-electrode 38 may be formed from materials such as Ni, Ni/Au, Ni/Ti, Ni/Pt, etc. A distance d between the p-electrode 38 that also functions as a reflecting mirror and the center of the active layer 32 has a value equal to or within $\pm 10\%$ of $(k \cdot \lambda/2 + \lambda/4)/n$, (where $\lambda$ is the wavelength of light projected from the active layer 32, n is the mean refractive index of the p-type cladding layer 34 and the p-type contact layer 36 located between the active layer 32 and the reflecting mirror 38, and k is an integer). Taking the spectral spread of the light emitting diode into consideration, even when there is a variation of $\pm 10\%$ about the value $(k \cdot \lambda/2 + \lambda/4)/n$ for the distance d, the directivity achieved is almost as high as when the distance d is $(k \cdot \lambda/2 + \lambda/4)/n$. Higher directivity may be achieved when the value of the distance d from the center of the active layer 32 is preferably equal to or within $\pm 5\%$ of $(k \cdot \lambda/2 + \lambda/4)/n$, and even more preferably when this is equal to or within $\pm 3\%$ of $(k \cdot \lambda/2 + \lambda/4)/n$.

The n-electrode 28 may be formed from materials such as Ti/Al, Ti/Mo, Hf/Al, Hf/Au, etc.

The lens 20 may be formed from any kind of resin material, glass, etc.

As shown in the plan view of FIG. 2, the p-electrode 38 is formed in a circular shape. The n-electrode 28 is formed in a ring shape that surrounds the p-electrode 38. An inner circumference and an outer circumference of the ring-shaped n-electrode 28 have a similar shape to the circular p-electrode 38. The centers of the p-electrode 38 and the n-electrode 28 have an identical location. With this configuration, the distribution of electric current flowing through the active layer 32 can be arranged to have scarcely any asymmetrical polarization.

Figure 3:
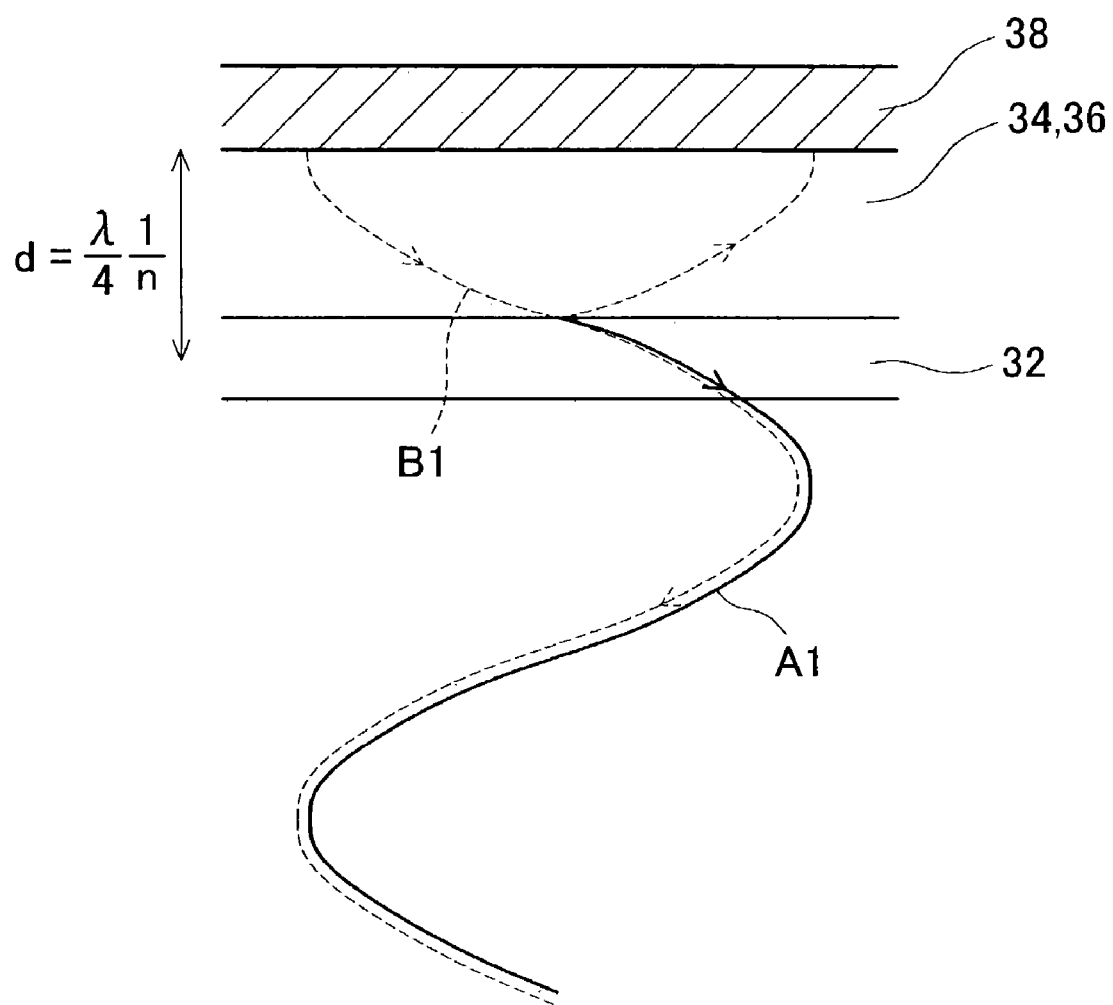
FIG. 3 shows a view illustrating interaction between light emitted from an active layer and light reflected from a reflecting mirror (1).

As shown in FIG. 1, the light emitting diode of the present embodiment has the reflecting mirror 38 formed only on one of the two sides of the active layer 32, that is, on the side opposite the light projecting face 21. As a result, light projected from the active layer 32 toward the light projecting face 21, and light projected from the active layer 32 toward the reflecting mirror 38 and reflected therefrom, mutually interferes. When the light projected from the active layer 32 toward the reflecting mirror 38 is reflected therefrom, the phase undergoes a $\pi$ transformation. Consequently, when the optical path difference is $2 \cdot n \cdot d = k \cdot \lambda + \lambda/2$, that is, when the distance d between the center of the active layer 32 and the reflecting mirror 38 satisfies the equation $d=(k \cdot \lambda/2 + \lambda/4)/n$, the light projected in a perpendicular direction from the light projecting face 21 becomes stronger as a result of interfering with the light reflected from the reflecting mirror 38. The definitions of $\lambda$, n, and k remain as above. FIG. 3 shows the relationship between perpendicular projected light A1 and reflected projected light B1 wherein $d=(k \cdot \lambda/2 + \lambda/4)/n$, k=0 that is, when $d=\lambda/(4n)$. In this case, the perpendicular projected light A1 and the reflected projected light B1 interferes and becomes stronger.

Figure 4:
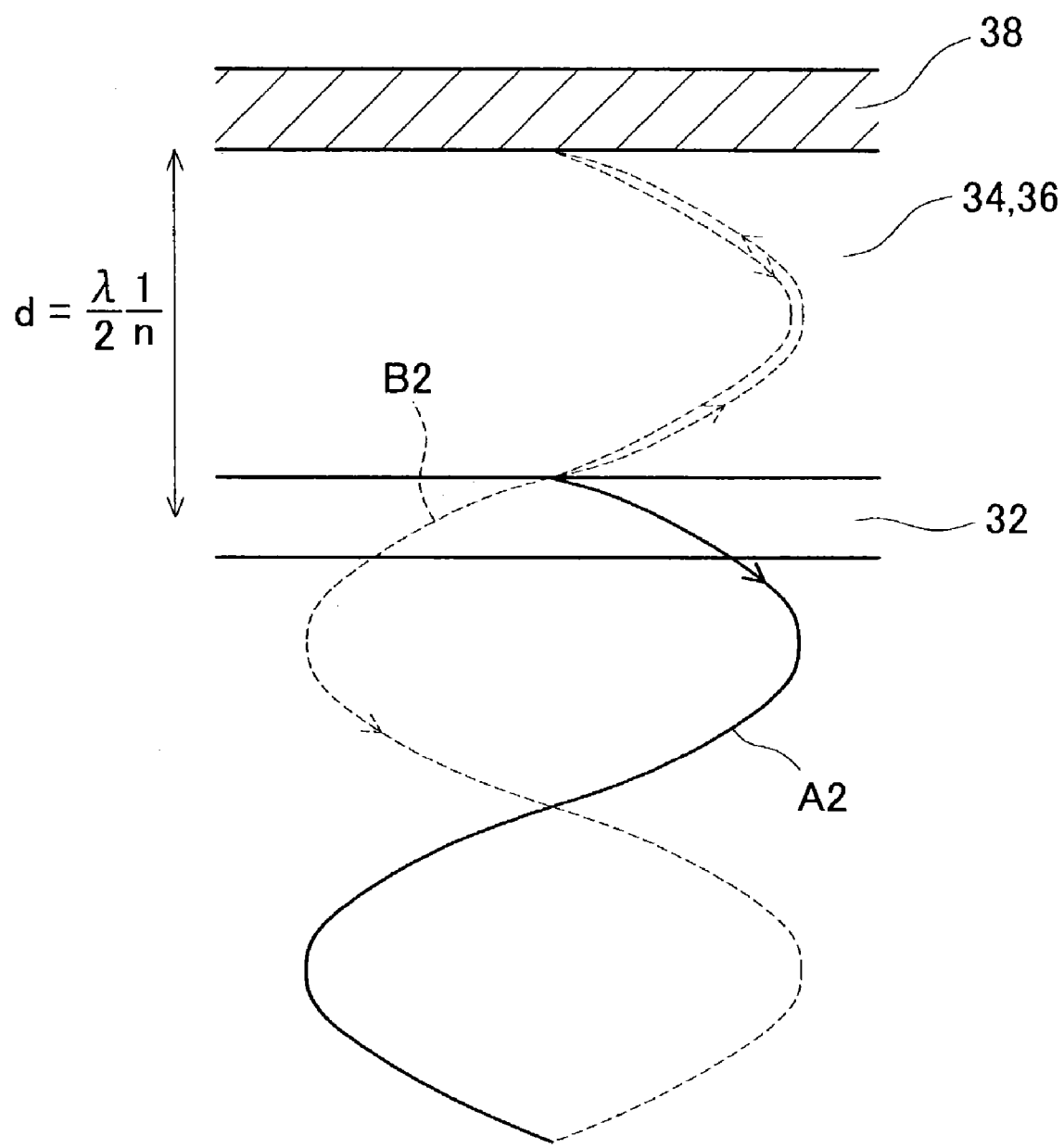
FIG. 4 shows a view illustrating interaction between light emitted from the active layer and light reflected from the reflecting mirror (2).

By contrast, if the optical path difference is $2 \cdot n \cdot d = k \cdot \lambda$, that is, if the distance d between the center of the active layer 32 and the reflecting mirror 38 satisfies the equation $d=(k \cdot \lambda/2)/n$, the light is maximally weakened by the interference between the projected light and the reflected light. FIG. 4 shows the relationship between perpendicular projected light A2 and reflected projected light B2 wherein $d=(k \cdot \lambda/2)/n$, k=1 that is, when $d=\lambda/(2n)$. In this case, the perpendicular projected light A2 and the reflected projected light B2 interferes and becomes maximally weaker.

Figure 5:
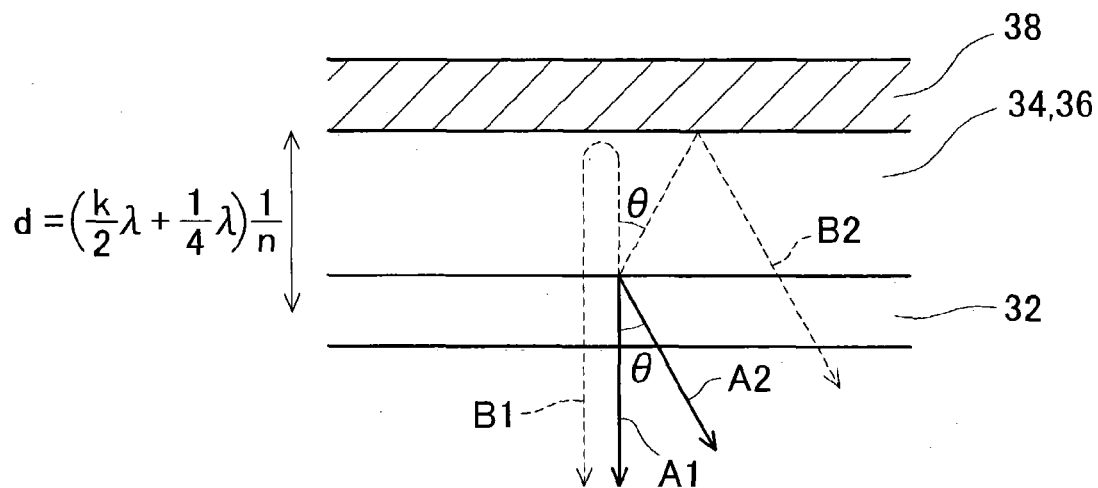
FIG. 5 shows a view illustrating interaction between light emitted from the active layer and light reflected from the reflecting mirror (3).

In other words, as shown in FIG. 5, the optical path difference of the light emitting diode of the present embodiment is established as $2 \cdot n \cdot d = k \cdot \lambda + \lambda/2$, that is, the distance d between the center of the active layer 32 and the reflecting mirror 38 satisfies the equation $d=(k \cdot \lambda/2 + \lambda/4)/n$. Consequently, light from the active layer 32 projected in a perpendicular manner toward the light projecting face 21, and light from the active layer 32 projected in a perpendicular manner toward the reflecting mirror 38 and reflected therefrom in a perpendicular manner, interferes and becomes stronger. However, light from the active layer 32 that is inclined at an angle $\theta$ and projected toward the light projecting face 21, and light from the active layer 32 that is inclined at the angle $\theta$ and projected toward the reflecting mirror 38 and reflected therefrom in an inclined manner, interferes and becomes weaker.

As a result, the spread of light emitted by the light projecting face 21 is substantially narrower than in the case of the conventional light emitting diode, and directivity can be substantially improved.

Figure 6:
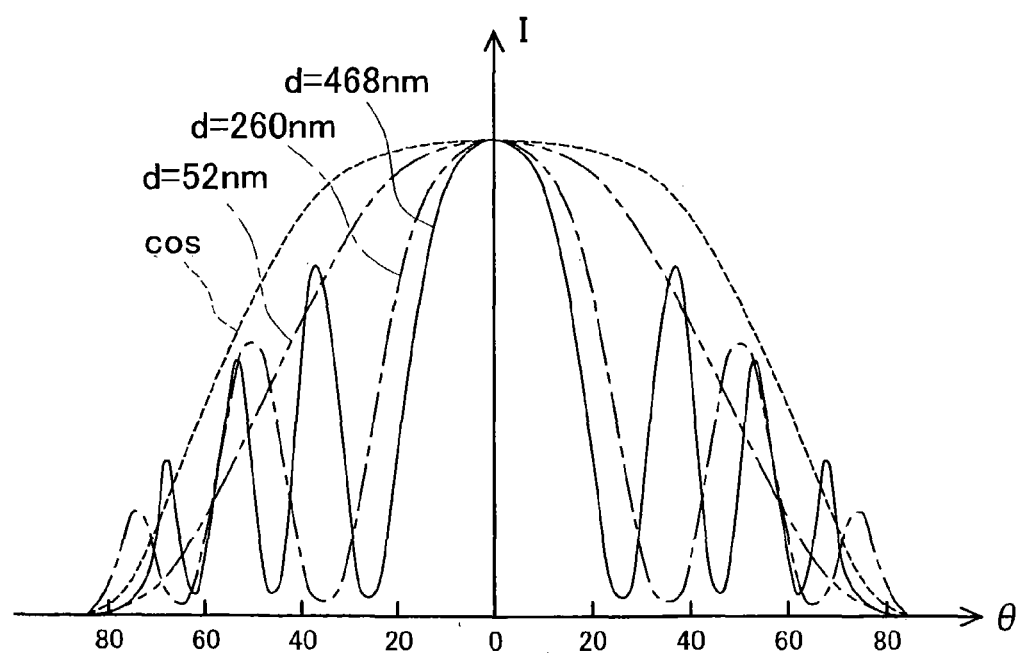
FIG. 6 shows a view showing distribution of intensity of projected light relative to an spread angle of projected light.

FIG. 6 shows the intensity distribution of the projected light relative to the spread angle $\theta$ of projected light when the distance d between the center of the active layer 32 and the reflecting mirror 38 is adjusted. The values d=52 nm, 260 nm, 468 nm in FIG. 6 are the values in the formula $d=(k \cdot \lambda/2 + \lambda/4)/n$ when k is equal to 0, 2, 4, respectively. Moreover, $\lambda$ is 520 nm, and n is 2.5. Further, for purposes of comparison, the cosine distribution is also shown. These distributions are normalized for the value of the light intensity when the spread angle $\theta$ is 0 degrees. In fact, the area (energy) of all the distributions are equal.

As is clear from FIG. 6, the range of spread angle $\theta$ having larger light intensity is narrower, relative to the cosine distribution, no matter whether d=52 nm, 260 nm, or 468 nm. Hence, directivity increases. Further, the larger the distance d between the center of the active layer 32 and the reflecting mirror 38, the narrower the spread angle range of the emitted light. Hence, directivity can be further increased.

Figure 7:
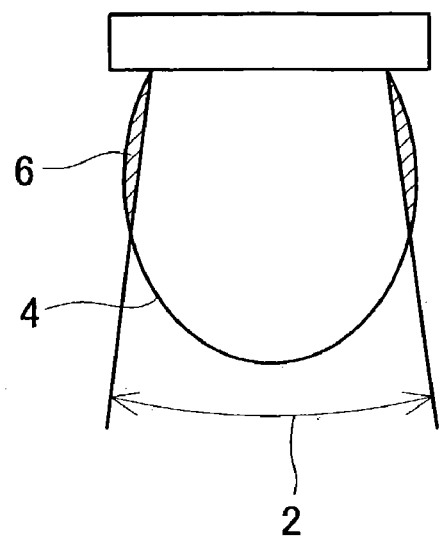
FIG. 7 shows a view schematically showing distribution of intensity of projected light in the light emitting diode of the embodiment of the present invention.

By providing the light emitting diode of the present embodiment with the reflecting mirror 38, directivity is sufficiently increased. Further, since the p-electrode 38 and the n-electrode 28 have the shapes described above, there is scarcely any asymmetrical polarization in the distribution of electric current flowing through the active layer 32 and the p-electrode 38. As a result, an increased proportion of light projected from the light emitting diode can enter the area within a specified angle. As shown schematically in FIG. 7, this light emitting diode allows a higher proportion of emitted light 4 to enter within an entry angle area 2 of an optical fiber consisting of POF or the like. That is, the coupling efficiency with the optical fiber consisting of POF or the like can be improved. The reflecting mirror 38 of the light emitting diode of the present embodiment is formed from a single layer of Ni. Furthermore, this Ni is also utilized as the p-electrode. As a result, the configuration thereof is simple, and manufacture is cheap and extremely easy.

Since the light emitting diode of the present embodiment allows a higher coupling efficiency with the optical fiber consisting of POF or the like, and less loss occurs, the light emitting diode of the present embodiment is extremely suitable as a light source for short range optical communications utilizing POF. The present embodiment has the useful result of enabling short range optical communications without utilizing semiconductor lasers which require DBR (Distributed Bragg Reflector) structures, these latter being extremely time-consuming and troublesome to manufacture.

Next, a manufacturing method for the green-light light emitting diode of the present embodiment will be described with reference to FIGS. 8 to 14.

Figure 8:
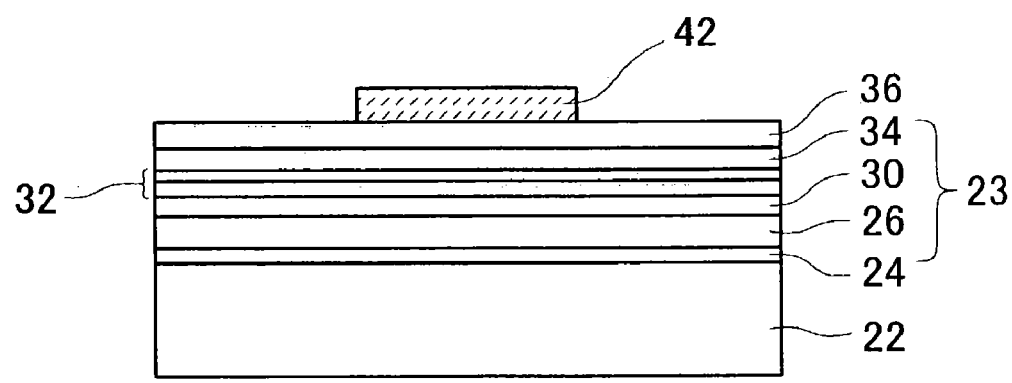
FIG. 8 shows a view showing a portion of a manufacturing process for the light emitting diode of the embodiment of the present invention (1).
Figure 9:
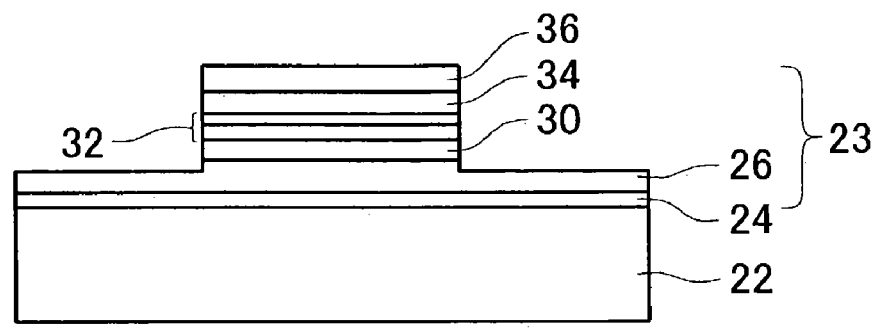
FIG. 9 shows a view showing a portion of the manufacturing process for the light emitting diode of the embodiment of the present invention (2).

First, as shown in FIG. 8, the layer structure 23 is formed above the sapphire substrate 22 (this being an example of a substrate) by means of the metalorganic vapor phase epitaxial growth (MOVPE) method. The layer structure 23 comprises: the AlN low temperature buffer layer 24 (this being an example of a buffer layer), the n-type GaN layer 26 (this being an example of an n-type contact layer), the n-type AlGaN layer 30 (this being an example of an n-type cladding layer), the multi-quantum-well active layer (InGaN and GaN) 32 (this being an example of an active layer), the p-type AlGaN layer 34 (this being an example of a p-type cladding layer), and the p-type GaN layer 36 (this being an example of a p-type contact layer). At this juncture, the p-type AlGaN layer 34 and the p-type GaN layer 36 have a total thickness of 260 nm. In the formula $d=(k\cdot\lambda/2+\lambda/4)/n$, this requires that $k=2$, $\lambda=520$ nm, and $n=2.5$. Further, the layer structure 23 can also be grown by vapor growth methods such as molecular-beam epitaxial growth (MBE), halide vapor phase epitaxial growth (HVPE), etc. Subsequently, a photo resist is applied to the p-type GaN layer 36 at the surface of the layer structure 23. Then the photolithography method is utilized to perform patterning on the photo resist, a photo resist 42 remaining only on a circular portion having a 150 μm diameter. This state is shown in FIG. 8.

Figure 10:
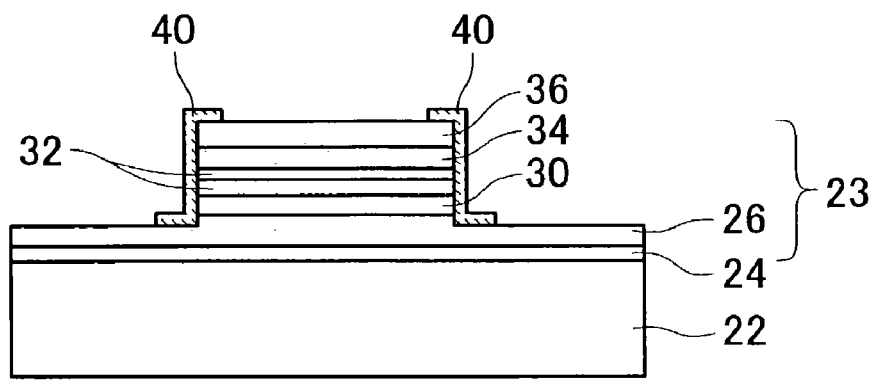
FIG. 10 shows a view showing a portion of the manufacturing process for the light emitting diode of the embodiment of the present invention (3).
Figure 11:
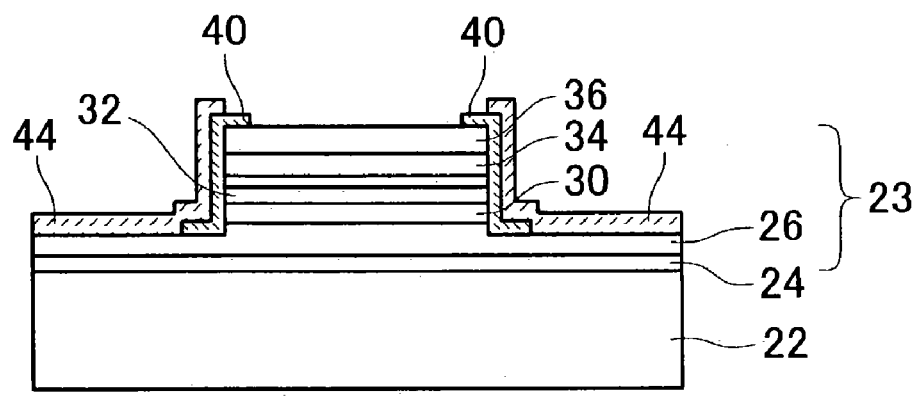
FIG. 11 shows a view showing a portion of the manufacturing process for the light emitting diode of the embodiment of the present invention (4).

Subsequently, the circular photo resist 42 shown in FIG. 8 is masked, and an RIE (Reactive Ion Etching) device utilizing a mixed gas of $BCl_3$ and $N_2$ etches the portions of the p-type GaN layer 36, the p-type AlGaN layer 34, the active layer 32, and the n-type AlGaN layer 30 that are outside the photo resist 42, thereby forming a mesa shape and exposing the n-type GaN layer 26 that comprises the contact layer. Next, the circular photo resist 42 is peeled off. This is the state shown in FIG. 9. Then, a silicon oxide film ($SiO_2$ film) is formed by the thermal CVD (Chemical Vapor Deposition) method across the entirety of the surface of the mesa-shaped layer structure 23. Then, the photolithography method is utilized to etch the silicon oxide film at a central portion and outer sides of the surface of the mesa-shaped layer structure 23. By this means, as shown in FIG. 10, only a ring-shaped silicon oxide film 40 remains, this covering peripheral end faces of the p-type GaN layer 36, the p-type AlGaN layer 34, the active layer 32, and the n-type AlGaN layer 30, these being exposed at a mesa step portion of the mesa-shaped layer structure 23.

Figure 12:
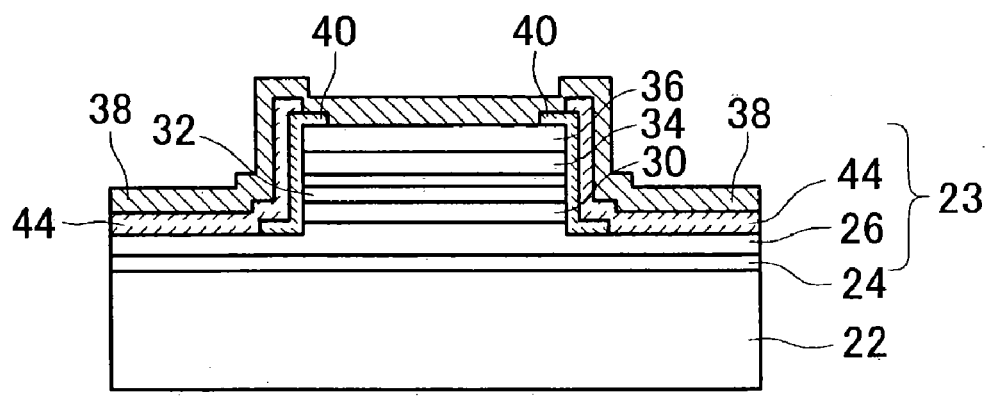
FIG. 12 shows a view showing a portion of the manufacturing process for the light emitting diode of the embodiment of the present invention (5).
Figure 13:
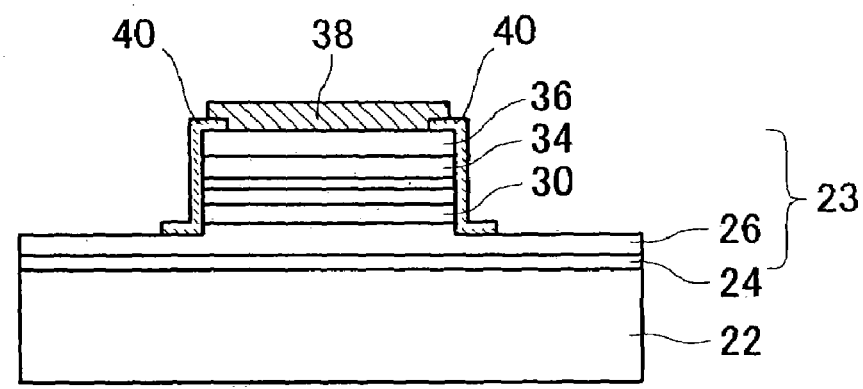
FIG. 13 shows a view showing a portion of the manufacturing process for the light emitting diode of the embodiment of the present invention (6).
Figure 14:
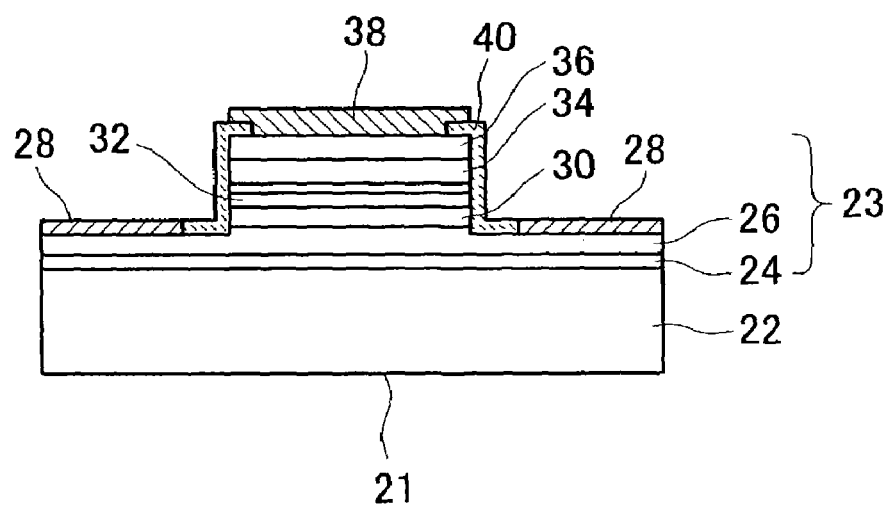
FIG. 14 shows a view showing a portion of the manufacturing process for the light emitting diode of the embodiment of the present invention (7).

Subsequently, a photo resist is applied across the entirety of the surface (this including the silicon oxide film 40) of the mesa-shaped layer structure 23, and then the photo resist is removed only from the central portion of the surface of the mesa-shaped layer structure 23 (see FIG. 11), so that a photo resist 44 remains on the side portions of the surface of the layer structure 23. Then, as shown in FIG. 12, Ni 38 is deposited by the sputtering method over the entirety of the surface (this including the photo resist 44) of the mesa-shaped layer structure 23. Then, as shown in FIG. 13, the photo resist 44 is removed, this also removing the Ni 38 deposited thereupon, so that the deposited Ni 38 remains only on the central portion of the surface of the mesa-shaped layer structure 23 (the lift-off method). The Ni 38 functions as both as the p-electrode 38 and as a reflecting mirror. Next, as shown in FIG. 14, a Ti/Al 28, (this being an example of an n-electrode), is formed on the side portions of the surface of the mesa-shaped layer structure 23, this being formed by the lift-off method in essentially the same manner as the Ni 38 was formed.

Subsequently, the device that has been made as described above is annealed for 5 minutes in $N_2$ at 500° C., the interfaces between the p-type GaN layer 36 and the Ni 38, and between the n-type GaN layer 26 and the Ti/Al 28 thereby being alloyed, thus improving contact. Then, the sample is separated into chips, and the Ni 38 (p-electrode) and the Ti/Al 28 (n-electrode) are soldered to a pedestal having an electrode for joining the p-electrode Ni 38 and n-electrode TiAl 28 already formed thereon.

When the intensity distribution of the emitted light is measured while electric current flows through the p-electrode 38 and the n-electrode 28 of the light emitting diode manufactured as described above, a high directivity light distribution pattern is obtained wherein approximately 80% of light is concentrated within an area of ±20 degrees from a reference point that comprises the direction perpendicular to the layer face of the active layer 32. Further, a convex lens (see No. 20 in FIG. 1) is attached to the light projecting face 21 of the light emitting diode, this reducing the spread range of light to less than or equal to ±15 degrees relative to the reference point that comprises the direction perpendicular to the layer face of the active layer 32, such that extremely high coupling efficiency is obtained wherein 90% or more light enters a POF having a diameter of 300 μm.

Figure 15:
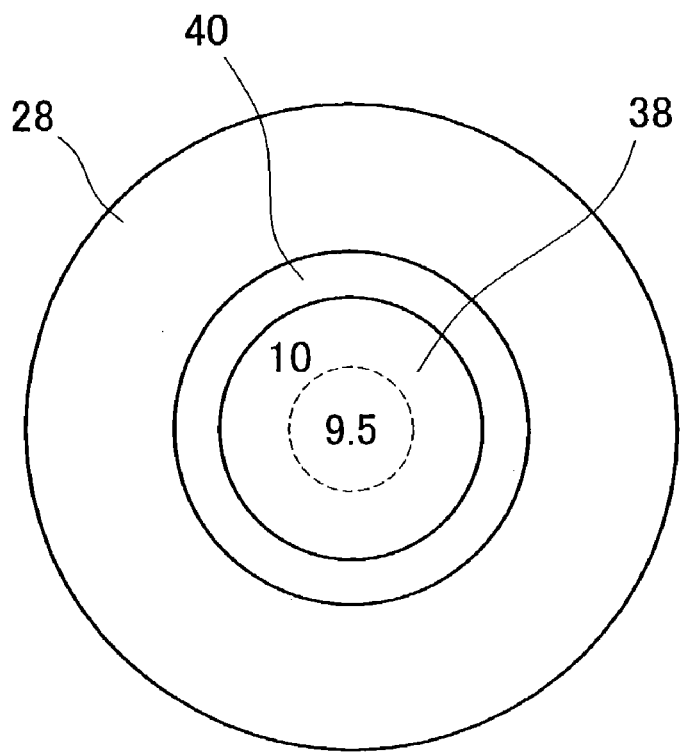
FIG. 15 shows a view schematically showing distribution of intensity of emitted light in the light emitting diode of the embodiment of the present invention.

Furthermore, FIG. 15 shows a schematic representation of the numerical values for the intensity distribution of emitted light of the light emitting diode of the present embodiment. As shown in FIG. 15, no asymmetrical polarization occurs in the distribution of intensity of the emitted light in the active layer below the p-electrode 38, the distribution of light intensity being such that there is the same intensity of emitted light and an identically varying shape of emitted light along rings concentric with respect to the center of the p-electrode 38 (here, only two values of emitted light intensity, namely 9.5 and 10, are shown). Approximately 30% more light can enter the POF when emitted from this light emitting diode than when light is emitted from a conventional light emitting diode provided with a rectangular electrode having an identical area.

The embodiment above merely illustrates some possibilities of the invention and does not restrict the claims thereof. The art set forth in the claims encompasses various transformations and modifications to the embodiment described above.

Figure 16:
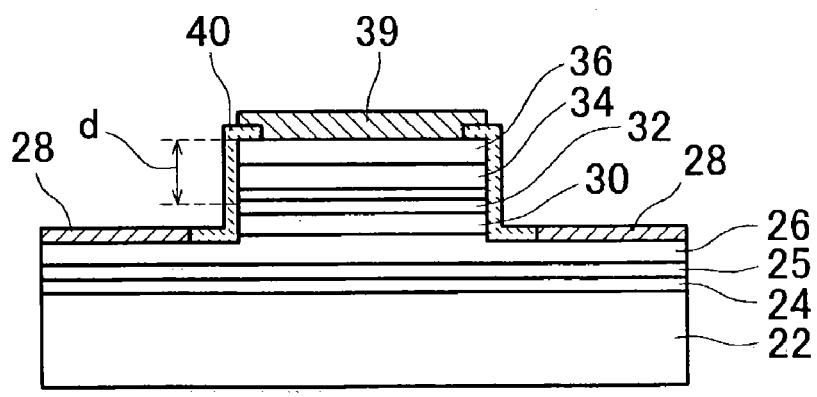
FIG. 16 shows a schematic cross-sectional view showing another embodiment of the light emitting diode of the present invention.

(1) In the embodiment described above, a configuration was described wherein light emitted from the active layer 32 is projected toward the side having the sapphire substrate 22. However, a configuration is equally possible wherein light emitted from the active layer 32 is projected toward the side opposite the sapphire substrate 22. In that case, as shown in FIG. 16, a reflecting mirror 25 is formed on one of the two sides of the active layer 32, that is, on the side thereof opposite a p-electrode 39 (in FIG. 16 the reflecting mirror 25 is between the buffer layer 24 and the n-type contact layer 26). This reflecting mirror 25 may be located at or within ±10% of $(k \cdot \lambda/2 + \lambda/4)/n$ from the center of the active layer 32. In this case, the reflecting mirror 25 is preferably formed from, for example, TiN, CoSi, or the like. By making the p-electrode 39 suitably thin, transparency relative to the projected light can be ensured while the necessary conductivity is also ensured.

(2) In the embodiment described above, a configuration was described wherein the reflecting mirror also functions as the p-electrode 38. However, it is of course also possible that the reflecting mirror does not also function as an electrode, but is formed independently only as a reflecting mirror. For example, the reflecting mirror may be formed between the p-type contact layer 36 and the p-type cladding layer 34. In this case, the reflecting mirror is preferably formed from, for example, TiN, CoSi, or the like.

Further, although this would complicate the manufacturing process, the reflecting mirror may be formed from a DBR (Distributed Bragg Reflector) structure such as used in semiconductor lasers, this consisting of semiconductor multi-layer films, dielectric multi-layer films, metal multi-layer films, or the like.

Figure 17:
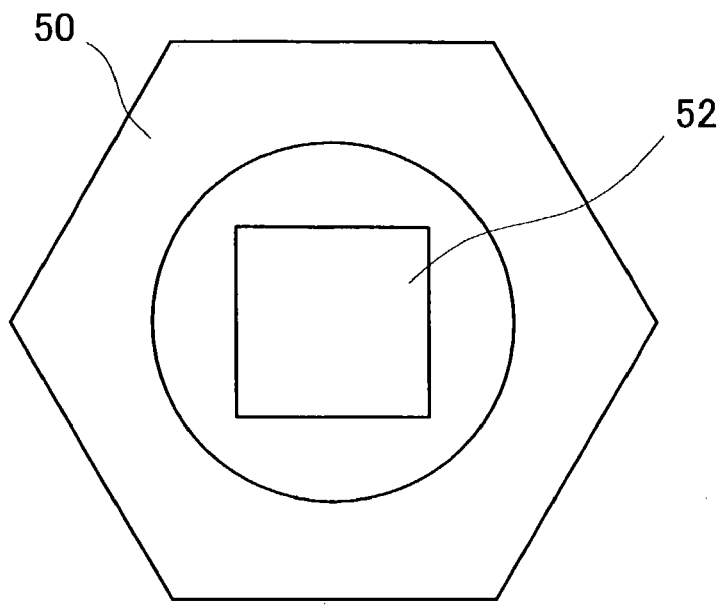
FIG. 17 shows a schematic plan view showing another embodiment of the light emitting diode of the present invention (1).
Figure 18:
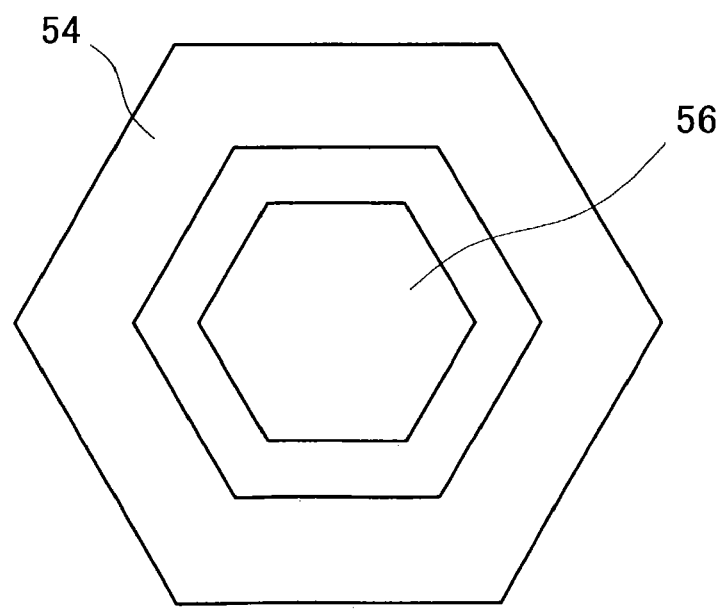
FIG. 18 shows a schematic plan view showing another embodiment of the light emitting diode of the present invention (2).

(3) In the embodiment described above, an example was described wherein the p-electrode 38 has a circular shape when viewed from above, and the n-electrode 28 is formed in a ring shape that surrounds the p-electrode 38. However, a configuration such as that in FIG. 17 is also possible wherein a p-electrode 52 has a square shape and an n-electrode 50 surrounds the p-electrode 52, the centers of both electrodes 52 and 50 having an identical location. In that case, as shown in FIG. 17, an inner circumference of the n-electrode 50 may be circular, and an outer circumference thereof may be hexagonal, so that this differs in shape from the square p-electrode 52. Further, as shown for example in FIG. 18, a configuration is possible wherein, when viewed from above, a hexagonal p-electrode 56 is surrounded by an n-electrode 54 having a similar shaped hexagonal inner circumference and outer circumference, the centers of both electrodes 56 and 54 having an identical location.

(4) The manufacturing method of the embodiment described above may equally well be replaced by the following manufacturing method.

Figure 19:
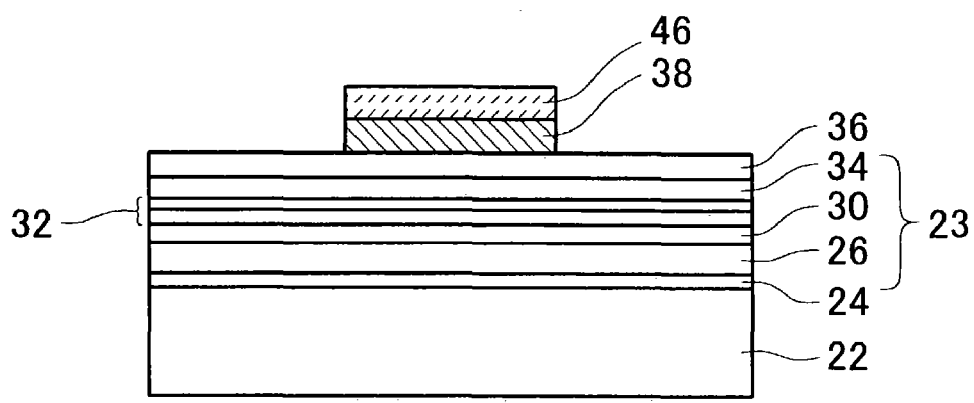
FIG. 19 shows a view showing a portion of another manufacturing process for the light emitting diode of the embodiment of the present invention (1).
Figure 20:
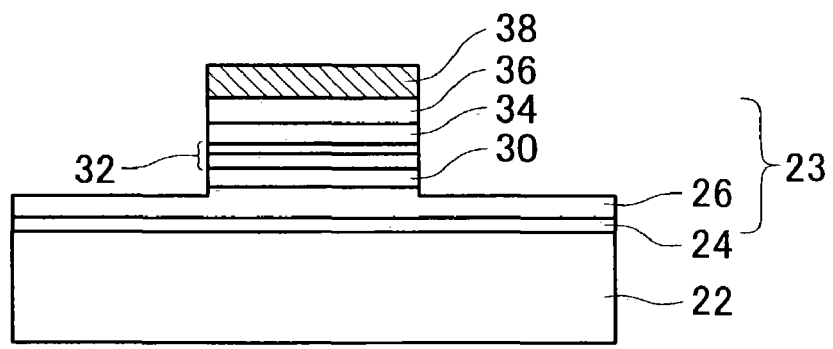
FIG. 20 shows a view showing a portion of another manufacturing process for the light emitting diode of the embodiment of the present invention (2).
Figure 21:
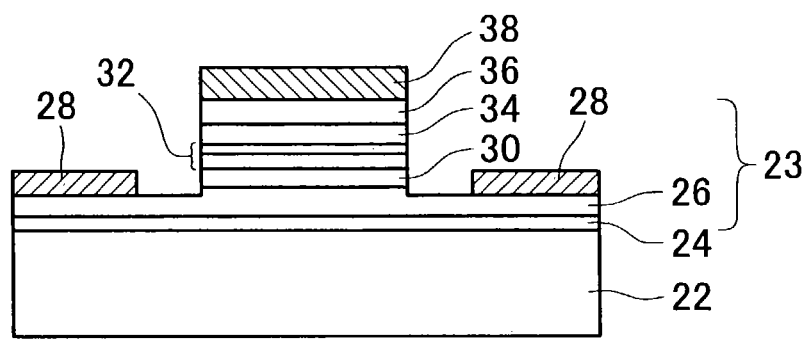
FIG. 21 shows a view showing a portion of another manufacturing process for the light emitting diode of the embodiment of the present invention (3).
Figure 22:
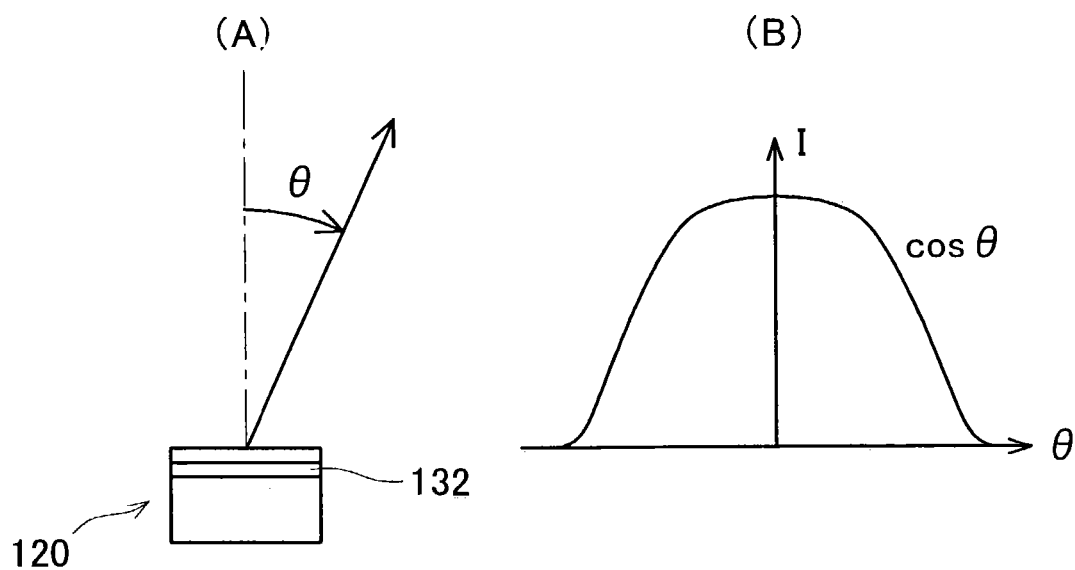
FIGS. 22(A) and (B) show views showing distribution of intensity of projected light in a light emitting diode.
Figure 23:
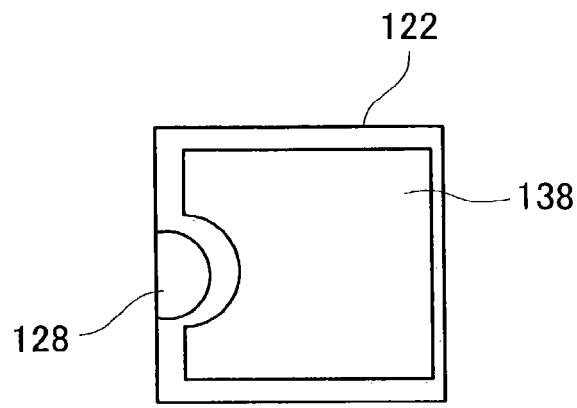
FIG. 23 shows a schematic plan view showing a conventional light emitting diode.
Figure 24:
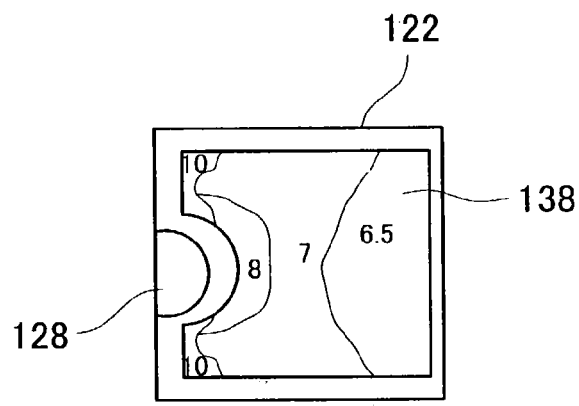
FIG. 24 shows a view schematically showing distribution of intensity of emitted light in a conventional light emitting diode.
Figure 25:
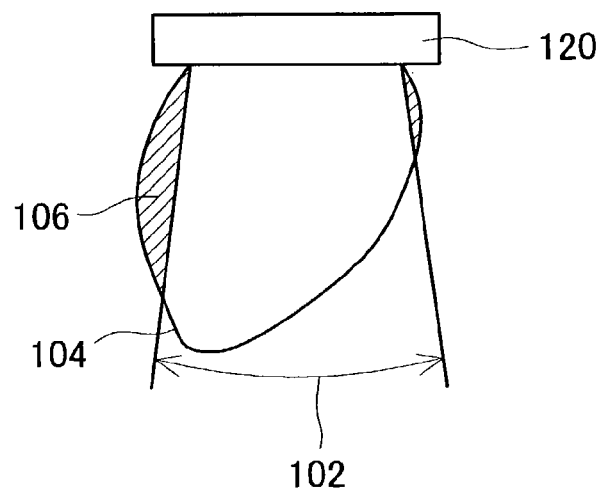
FIG. 25 shows a view schematically showing distribution of intensity of projected light in a conventional light emitting diode.

First, a layer structure 23, shown in FIG. 19, is formed by the same manufacturing method as in the embodiment described above. Then, Ni is deposited on a p-type GaN layer 36, this being an uppermost surface of the layer structure 23, and then a photo resist is applied above the Ni. Then the photolithography method is utilized to perform patterning on the photo resist, a photo resist 46 remaining only on a circular portion having a 150 μm diameter. Then the circular photo resist 46 is masked, and nitric acid is utilized to dissolve the Ni on the portions outside the photo resist 46, so that Ni 38 remains only on a circular portion concentric with the photo resist 46. Next, the circular photo resist 46 is masked and, as with the manufacturing method of the embodiment described above, a mesa shape (see FIG. 20) is formed and an n-type GaN layer 26 that comprises the contact layer is exposed. Then, the circular photo resist 46 on the Ni 38 is peeled off. Then, as with the manufacturing method of the embodiment described above, the lift-off method is utilized to form Ti/Al 28 on outer sides of the face of the mesa-shaped layer structure 23, as shown in FIG. 21.

Further, the technical elements disclosed in the present specification or figures may be utilized separately or in all types of conjunctions and are not limited to the conjunctions set forth in the claims. Furthermore, the art disclosed in the present specification or figures may be utilized to simultaneously realize a plurality of aims or to realize one of these aims.

The invention claimed is:

1. A nitride semiconductor light emitting diode comprising:
   an active layer comprising a nitride semiconductor; and
   a reflecting mirror separated by a distance of approximately $(k \cdot \lambda/2 + \lambda/4)/n$ from a center of the active layer, where
   $\lambda$ is the wavelength of light projected from the active layer,
   n is the mean refractive index of an area between the active layer and the reflecting mirror, and
   k is an integer.

2. A nitride semiconductor light emitting diode as set forth in claim 1, wherein the reflecting mirror is also an electrode for supplying electric current to the active layer.

3. A nitride semiconductor light emitting diode as set forth in claim 1, further comprising a convex lens on a side of the active layer opposite the reflecting mirror.

4. A nitride semiconductor light emitting diode comprising:
   a substrate;
   an active layer comprising a nitride semiconductor on the substrate; and
   a reflecting mirror laminated above the active layer, the reflecting mirror being separated by a distance of approximately $(k \cdot \lambda/2 + \lambda/4)/n$ from a center of the active layer, where
   $\lambda$ is the wavelength of light projected from the active layer,
   n is the mean refractive index of an area between the active layer and the reflecting mirror, and
   k is an integer.

5. A nitride semiconductor light emitting diode comprising:
   a substrate;
   a nitride semiconductor on the substrate,
      where the nitride semiconductor is thick at a central portion thereof and thin at a peripheral portion thereof, and
      where the nitride semiconductor has an active layer in the thick central portion thereof;
   a first electrode on an upper face of the thick central portion; and
   a second electrode on an upper face of the thin peripheral portion, wherein
   the nitride semiconductor light emitting diode further comprises a reflecting mirror formed above the active layer of the thick central portion, the reflecting mirror being separated by a distance of approximately $(k \cdot \lambda/2 + \lambda/4)/n$ from a center of the active layer, where
   $\lambda$ is the wavelength of light projected from the active layer,
   n is the mean refractive index of an area between the active layer and the reflecting mirror, and
   k is an integer.

* * * * *